US010351969B2

(12) United States Patent
Okumura et al.

(10) Patent No.: US 10,351,969 B2
(45) Date of Patent: Jul. 16, 2019

(54) SAPPHIRE MEMBER AND METHOD FOR MANUFACTURING SAPPHIRE MEMBER

(71) Applicant: KYOCERA Corporation, Kyoto-shi, Kyoto (JP)

(72) Inventors: Masahiro Okumura, Yasu (JP); Shinya Kato, Moriyama (JP); Yoshihide Ozaki, Hikone (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 15/561,849

(22) PCT Filed: Mar. 28, 2016

(86) PCT No.: PCT/JP2016/059900
§ 371 (c)(1),
(2) Date: Sep. 26, 2017

(87) PCT Pub. No.: WO2016/153070
PCT Pub. Date: Sep. 29, 2016

(65) Prior Publication Data
US 2018/0112332 A1    Apr. 26, 2018

(30) Foreign Application Priority Data
Mar. 26, 2015 (JP) ................... 2015-063735

(51) Int. Cl.
*C30B 33/02* (2006.01)
*C30B 29/20* (2006.01)
(Continued)

(52) U.S. Cl.
CPC .............. *C30B 33/02* (2013.01); *C30B 15/14* (2013.01); *C30B 29/20* (2013.01); *C30B 19/12* (2013.01); *C30B 29/406* (2013.01)

(58) Field of Classification Search
CPC .................................. C30B 33/02; C30B 15/14
See application file for complete search history.

(56) References Cited

U.S. PATENT DOCUMENTS

| 5,422,306 A * | 6/1995 | Niwa ............... B82Y 10/00 117/106 |
| 6,083,812 A * | 7/2000 | Summerfelt ........ H01L 21/0445 117/950 |

(Continued)

FOREIGN PATENT DOCUMENTS

| JP | H11-274568 A | 10/1999 |
| JP | 2004-256388 A | 9/2004 |

(Continued)

OTHER PUBLICATIONS

JP2008031027A—machine translation.*

(Continued)

*Primary Examiner* — Nathaniel Herzfeld
(74) *Attorney, Agent, or Firm* — Procopio Cory Hargreaves and Savitch LLP (57) ABSTRACT

A sapphire member containing sapphire as a main constituent has a main surface parallel to a c-plane of a sapphire crystal. The sapphire member includes a plurality of terrace structure layers in at least a part of the main surface. Each terrace structure layer includes a terrace surface parallel to the c-plane and a side surface in contact with an edge line of the terrace surface. When viewed in a plan in a direction perpendicular to the main surface, the part of the main surface includes a plurality of the edge lines that are curved and are not parallel to one another.

7 Claims, 9 Drawing Sheets

(51) Int. Cl.
*C30B 15/14* (2006.01)
*C30B 19/12* (2006.01)
*C30B 29/40* (2006.01)

(56) References Cited

U.S. PATENT DOCUMENTS

| | | | |
|---|---|---|---|
| 6,091,085 A | 7/2000 | Lester | |
| 6,153,010 A * | 11/2000 | Kiyoku | B82Y 20/00 |
| | | | 117/106 |
| 6,180,497 B1 * | 1/2001 | Sato | H01L 21/0203 |
| | | | 257/E21.216 |
| 7,060,597 B2 * | 6/2006 | Kurita | C30B 23/02 |
| | | | 438/504 |
| 8,110,484 B1 * | 2/2012 | Sato | C30B 25/04 |
| | | | 257/E21.113 |
| 8,390,023 B2 * | 3/2013 | Armitage | C30B 25/02 |
| | | | 257/103 |
| 2001/0030329 A1 * | 10/2001 | Ueta | B82Y 20/00 |
| | | | 257/103 |
| 2004/0177802 A1 | 9/2004 | Sprenger et al. | |
| 2015/0267321 A1 | 9/2015 | Lee et al. | |

FOREIGN PATENT DOCUMENTS

| | | |
|---|---|---|
| JP | 2006-327876 A | 12/2006 |
| JP | 2008-31027 A | 2/2008 |
| JP | 2010-168280 A | 8/2010 |
| WO | 2014/069784 A1 | 5/2014 |

OTHER PUBLICATIONS

International Search Report dated May 31, 2016, issued by Japan Patent Office for International Application No. PCT/JP2016/059900.

F. Cuccureddu et al., Surface morphology of c-plane sapphire (α-alumina) produced by high temperature anneal, Surface Science 604, 2010, p. 1294-1299 (6 pages), published online on Apr. 29, 2010, www.elsevier.com/locate/susc.

* cited by examiner

SAPPHIRE MEMBER AND METHOD FOR MANUFACTURING SAPPHIRE MEMBER

FIELD

The present disclosure relates to a sapphire member and a method for manufacturing a sapphire member.

BACKGROUND

Sapphire, which is a single crystal form of alumina, has crystal lattice constants similar to those of gallium nitride (GaN), which is a common material for light emitting diodes (LEDs). Sapphire is thus widely used as a substrate for growing GaN crystals for LEDs. Sapphire substrates for growing GaN crystals include, in addition to substrates with a precisely flat surface (main surface), sapphire substrates with an irregular main surface or with an appropriately roughened main surface for efficient growth of buffer layers to reduce defects caused by dislocations of GaN or other crystals. For example, Japanese Unexamined Patent Application Publication No. 11-274568 (Patent Literature 1) describes sapphire substrates having a main surface with recesses formed by reactive ion etching or having a main surface roughened by mechanical polishing using relatively coarse abrasive grains.

BRIEF SUMMARY

A sapphire member according to one or more embodiments contains sapphire as a main constituent and has a main surface along and parallel to a c-plane of a sapphire crystal. The sapphire member includes a plurality of terrace structure layers in at least a part of the main surface. Each terrace structure layer includes a terrace surface along the c-plane and a side surface in contact with an edge line of the terrace surface.

A method for manufacturing the sapphire member includes preparing a base material having a main surface along the c-plane of the sapphire crystal, heating the base material to a temperature in a range of 1800 to 2000° C., and slowly cooling the heated base material to room temperature in not less than six hours.

A method for manufacturing a sapphire member includes preparing a base material having a main surface along an m-plane of a sapphire crystal, heating the base material to a temperature in a range of 1800 to 2000° C., and slowly cooling the heated base material to room temperature in not less than six hours.

BRIEF DESCRIPTION OF DRAWINGS

FIGS. 2A and 2B are electron micrographs of sapphire members according to one or more embodiments, where FIG. 2A shows the sapphire member obtained through machining using a resin diamond plate as a polishing pad, and heating at 1950° C. for about 5 hours, followed by slow cooling, and FIG. 2B shows the sapphire member obtained through the machining, and heating at 1950° C. for about 40 hours, followed by slow cooling.

FIGS. 3A and 3B are electron micrographs of sapphire members according to one or more embodiments, where FIG. 3A shows the sapphire member obtained through machining using a cast iron plate as a polishing pad, and heating at 1950° C. for about 5 hours, followed by slow cooling, and FIG. 3B shows the sapphire member obtained through the machining, and heating at 1950° C. for about 40 hours, followed by slow cooling.

FIGS. 7A and 7B are electron micrographs of sapphire members each showing a main surface substantially parallel to an m-plane immediately after the machining with another method for manufacturing a sapphire member according to one or more embodiments, where FIG. 7A shows the sapphire member obtained through machining using a resin diamond plate as a polishing pad, and FIG. 7B shows the sapphire member obtained through machining using a cast iron plate as a polishing pad.

DETAILED DESCRIPTION

In surface profile formation, roughening the surface of a sapphire member through mechanical polishing can easily form fine scratches or a damaged layer on the surface of a sapphire substrate, and also can cause polishing dust and other matter resulting from polishing to adhere to the surface. A sapphire substrate with a damaged layer or with polishing dust, when used as a GaN crystal growth substrate, can easily have the damaged layer or polishing dust broken or coming off, and thus may not grow a crystal layer, or a GaN layer, in a stable manner. For a sapphire member processed by reactive ion etching to form recesses and protrusions on the processed surface, the bottom surfaces of the recesses and the top surfaces of the protrusions are typically inclined with respect to the crystal face of sapphire. The processed surface is likely to be misaligned with the sapphire crystal face. A GaN crystal cannot form regularly on the surface misaligned with the sapphire crystal face. The surface processed by, for example, reactive ion etching can take a relatively long time for a crystal to grow to form a buffer layer with high surface crystallinity. The surface processed by reactive ion etching also uses other processes including a preceding photolithography process, and thus takes a relatively long time and large efforts. The resultant sapphire substrate can be relatively expensive.

A sapphire substrate, which has high hardness to withstand damage, high light transmission, and high resistance to various chemicals, may be used in, for example, a storage tank for various chemical solutions. Such a storage tank formed by, for example, mechanical processing or grinding can have a disorderly roughened surface, and can scatter an excessively large amount of visible light at the main surface of the substrate and can reduce the light transmission of the sapphire substrate.

Figure 1A:
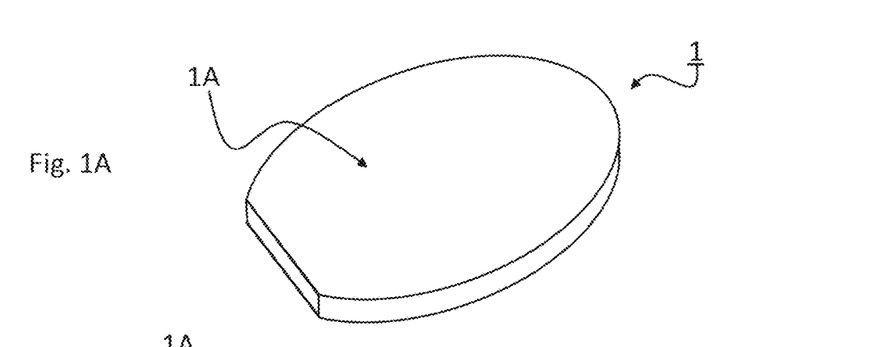
FIG. 1A is a schematic perspective view of a sapphire member according to one or more embodiments.
Figure 1B:
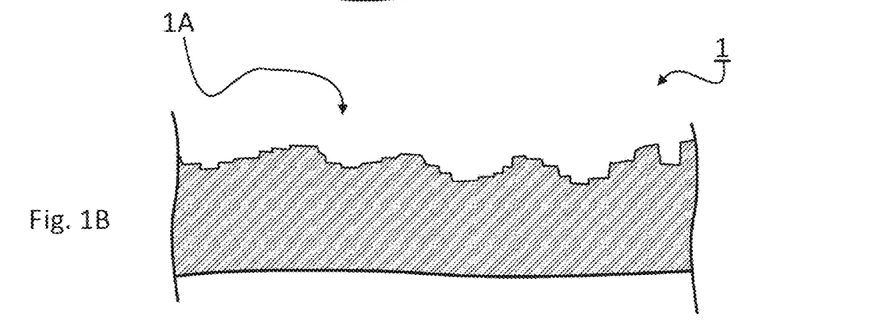
FIG. 1B is an enlarged sectional view of a portion of the sapphire member including its main surface.
Figure 1C:
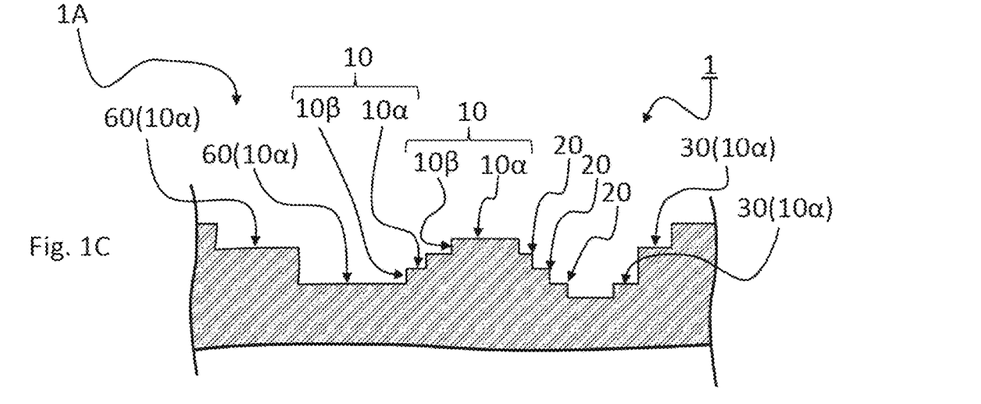
FIG. 1C is a further enlarged view of a portion of the sapphire member including the main surface.

A sapphire member according to the present embodiment and a method for manufacturing the sapphire member will now be described. FIG. 1A is a schematic perspective view of a sapphire member 1 according to the present embodiment. FIG. 1B is an enlarged sectional view of a portion of the sapphire member 1 including a main surface 1A. FIG. 1C is a further enlarged view of a portion of the sapphire member 1 including the main surface 1A.

FIGS. 2A, 2B, 3A, and 3B show examples of electron micrographs of the sapphire member 1. The electron micrographs shown in the drawings are all taken using the scanning electron microscope JSM-7001F (JEOL Ltd.). The sapphire member 1 shown in FIGS. 2A, 2B, 3A, and 3B is manufactured with a method for manufacturing a sapphire member according to one embodiment of the present invention. More specifically, the sapphire member 1 is manufactured through machining for preparing a base material having a main surface along the c-plane of a sapphire crystal, heating the base material to a temperature in a range of 1800 to 2000° C., and slowly cooling the heated base material to room temperature in not less than six hours. The photographs shown in FIGS. 2A, 2B, 3A, and 3B show the sapphire member 1 viewed in a plan in a direction perpendicular to the main surface 1A.

The sapphire member 1 according to the present embodiment is mainly composed of sapphire, and has a main surface 1A along (substantially parallel to) the c-plane of the sapphire crystal. The sapphire member 1 includes, in at least a part of its main surface 1A, a plurality of terrace structure layers 10 each having terrace surfaces 10α extending along (substantially parallel to) the c-plane of the sapphire crystal and side surfaces 10β in contact with an edge line 20 of the terrace surfaces 10α. In other words, specifically when the sapphire member 1 according to the present embodiment is viewed in a plan in a direction perpendicular to the main surface 1A, a plurality of curved edge lines 20 that are not parallel to one another (with varying intervals between the edge lines 20) are located in this surface part.

The main surface 1A has appropriate recesses and protrusions in the part of the main surface 1A in which such terrace structure layers are located. The sapphire member 1 used as, for example, a GaN crystal growth substrate allows an intended buffer layer to grow on the sapphire member 1 in a relatively short time. For example, a substrate called an off-angle substrate, which has a main surface inclined by a very small angle from the crystal face, such as the c-plane or a-plane, may have a step-terrace structure with a step height of about several tens to several hundreds of angstroms. This step-terrace structure has a plurality of straight ridgelines (ridgelines between a stepped portion and a terrace portion) extending parallel to one another in the direction corresponding to the direction of inclination. The off-angle substrate for forming an intended buffer layer within a relatively short time can have highly regularly arranged ridgelines and less surface irregularity. This structure causes large crystal grains to form locally at the initial stage of the crystal growth. Such crystal grains may disturb growth with entirely uniform crystal orientation, and delay formation of a sufficiently uniform buffer layer.

The sapphire member 1 has a plurality of curved edge lines 20 that are not parallel to one another, which reduce local formation of large crystal grains. The sapphire member 1 also has the terrace surfaces 10α along the c-plane of the sapphire crystal as described above. This structure allows the buffer layer having entirely uniform crystal orientation to grow, and allows an intended buffer layer to grow in a relatively short time.

The sapphire member 1 used as a crystal growth substrate may have terrace layer structures 10 across the entire main surface 1A. The sapphire member 1 may have a plurality of curved edge lines 20 that are not parallel to one another across the entire main surface 1A. The terrace layer structures 10 may be formed in at least a part of the main surface 1A, or the plurality of terrace layer structures 10 may be formed in discrete parts of the main surface 1A. To grow, for example, an intended buffer layer in a relatively short time, a plurality of terrace layer structures 10 may be located in an area larger than or equal to 50% of the area of the main surface 1A.

The sapphire member 1 has a plurality of terrace surfaces 10α, each including a flat portion 30 larger than at least 1 μm square. More specifically, each flat portion 30 larger than 1 μm square, which is equivalent to the wavelength of visible light, scatters less visible light. The sapphire member 1 thus scatters a relatively small portion of the transmitted visible light. When, for example, used as a storage tank for various chemical solutions, the sapphire member 1, which scatters less light and is highly visible, allows easier visual inspection of the state of the chemical solution inside the storage tank from outside through the sapphire member 1. The flat portions 30 of the terrace surfaces 10α are parallel to the c-plane of the sapphire crystal. Thus, the sapphire member 1 used as, for example, a GaN crystal growth substrate allows a GaN crystal with intended crystallinity to grow on the terrace surfaces 10α with a relatively large area. The sapphire member 1 with this structure allows a buffer layer having an intended surface with less crystal defects and high crystallinity to grow on the sapphire member 1 in a relatively short time.

The sapphire member 1 includes a plurality of terrace surfaces 10α, each including a flat portion 60 larger than at least 5 μm square. The flat portion 60 larger than 5 μm square scatters less visible light than the flat portion 30, and increases the visibility of the light that transmits through the sapphire member 1. The flat portions 60 of the terrace surfaces 10α facilitate growth of an intended GaN crystal and allow an intended buffer layer to grow on the flat portions 60 in a shorter time.

The sapphire member 1 includes a plurality of closed-curve circle edges 21 viewed in a plan in a direction perpendicular to the main surface 1A. A first circle edge with a longer perimeter encloses a second circle edge with a shorter perimeter without crossing the second circle edge. More specifically, the sapphire member 1 includes protrusions 40 each having a stepped surface and recesses 50 each having a stepped surface. The sapphire member 1 with this structure prevents locally uniform crystal grains from growing on the sapphire member 1 during, for example, growth of a buffer layer, and allows a buffer layer with high crystallinity to grow on the sapphire member 1 in a relatively short time.

Each protrusion 40 has a terrace surface 10α having the second circle edge with a shorter perimeter located above a terrace surface 10α having the first circle edge with a longer perimeter. Each recess 50 has a terrace surface 10α having the first circle edge with a longer perimeter located above a terrace surface 10α having the second circle edge with a shorter perimeter. Each protrusion 40 or each recess 50 has a plurality of terrace surfaces 10α. A buffer layer can also grow on the surfaces of such protrusions 40 and recesses 50 to have relatively high crystallinity.

The GaN crystal or other crystal has a hexagonal crystal lattice. When circle edges 21 include at least one substantially hexagonal circle edge 21, the substantially hexagonal circle edge 21 is aligned well with the growing GaN crystal. This structure also allows growth of the buffer layer with relatively high crystallinity. When each side of the hexagonal circle edge 21 extends along (substantially parallel to) the m-plane of the sapphire crystal, each side of the hexagon is substantially parallel to the corresponding side of the sapphire member 1, which serves as a growth substrate. The protrusions 40 and the recesses 50 are also aligned well with the GaN crystal, which grows with its crystal being aligned with the crystal of the sapphire member 1. This also allows growth of the buffer layer with relatively high crystallinity.

Figure 4:
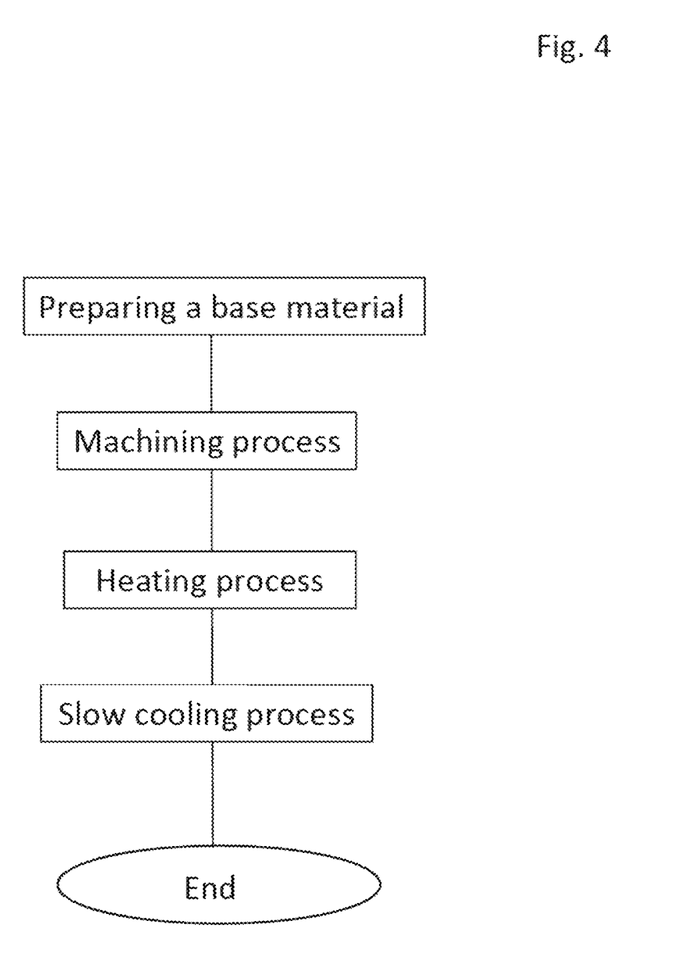
FIG. 4 is a flowchart showing a method for manufacturing a sapphire member according to one or more embodiments.

FIG. 4 is a flowchart showing a method for manufacturing the sapphire member according to one or more embodiments of the present invention. The flowchart shown in FIG. 4 also applies to the method for manufacturing the sapphire member 1 according to the present embodiment and also to other embodiments described later.

The method for manufacturing the sapphire member 1 according to the present embodiment will now be described. For example, a sapphire-based plate is prepared first. The sapphire-based plate is formed from sapphire, which is a single crystal form of alumina grown by a crystal growth method, such as the edge-defined film-fed growth (EFG) method. The method for growing sapphire, which is a single crystal form of alumina, is not limited, and may be, for example, the Kyropoulos method or the heat exchanger method (HEM).

The method according to the present embodiment includes machining the sapphire-based plate to have, for example, an arithmetic mean roughness Ra of greater than or equal to 0.1 μm to obtain a base material having a main surface along the c-plane of a sapphire crystal, heating the base material to a temperature in a range of 1800 to 2000° C., and slowly cooling the heated base material to room temperature in not less than six hours.

Through the machining, the surface of the sapphire-based plate is ground with, for example, a surface grinder, which places a workpiece into slidable contact with the surface of a moving grindstone to mechanically grind the workpiece, to obtain a base material having a main surface substantially parallel to the c-plane of the sapphire crystal. The main surface processed with, for example, a surface grinder is the surface of sapphire having very high hardness ground by mechanical processing, and has an arithmetic mean roughness Ra of greater than or equal to 0.1 μm, which is relatively high (the surface is rough).

Figure 5A:
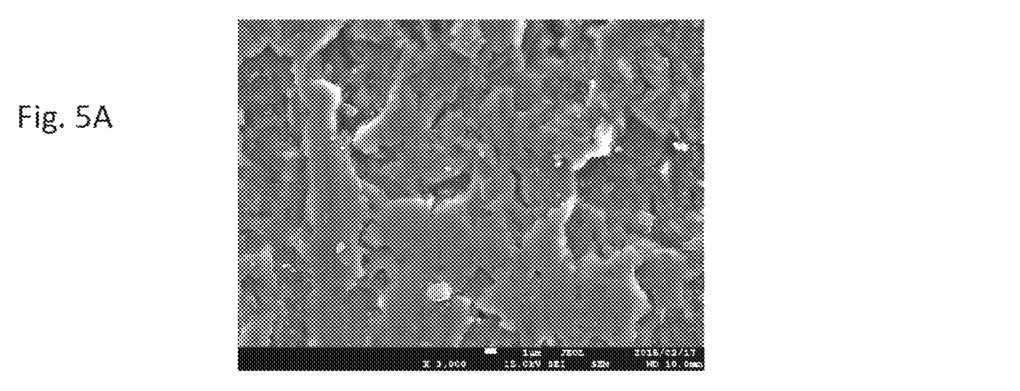
FIG. 5A is an electron micrograph of the sapphire member shown in FIG. 2A or 2B during manufacture showing a main surface of its base material immediately after the machining.
Figure 5B:
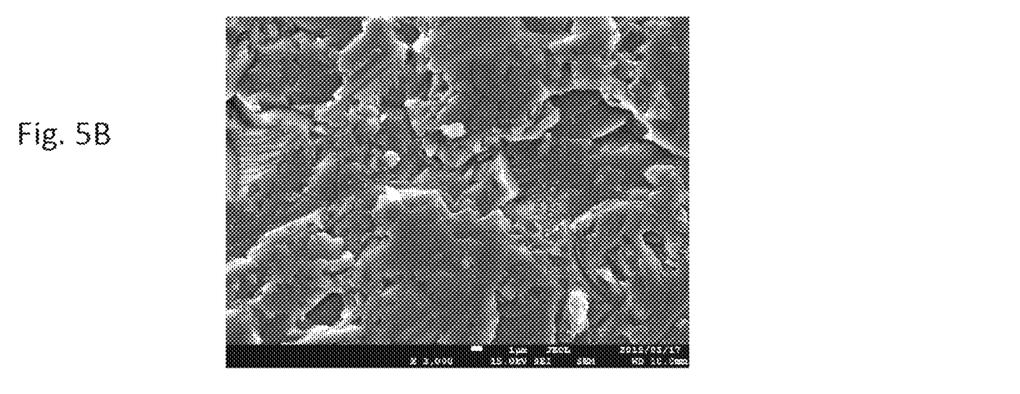
FIG. 5B is an electron micrograph of the sapphire member shown in FIG. 3A or 3B during manufacture showing a main surface of its base material immediately after the machining.

FIGS. 5A and 5B are electron micrographs of the main surfaces of the base materials immediately after the machining. FIG. 5A shows the sapphire member machined with a surface grinder using a resin diamond plate as a polishing pad. FIG. 5B shows the sapphire member machined with a surface grinder using a cast iron plate as a polishing pad. More specifically, FIG. 5A shows the sapphire member polished (ground) with a surface grinder (Mitsui High-tec, Inc.) using a resin diamond plate #325 as a polishing plate in a 0.05-mm traverse mode. FIG. 5B shows the sapphire member polished with a lapping machine (Kyoritsu Seiki Corporation) using a cast iron plate as a polishing plate and diamond slurry with an average particle diameter of 25 μm in a self-weight mode.

Figure 2A:
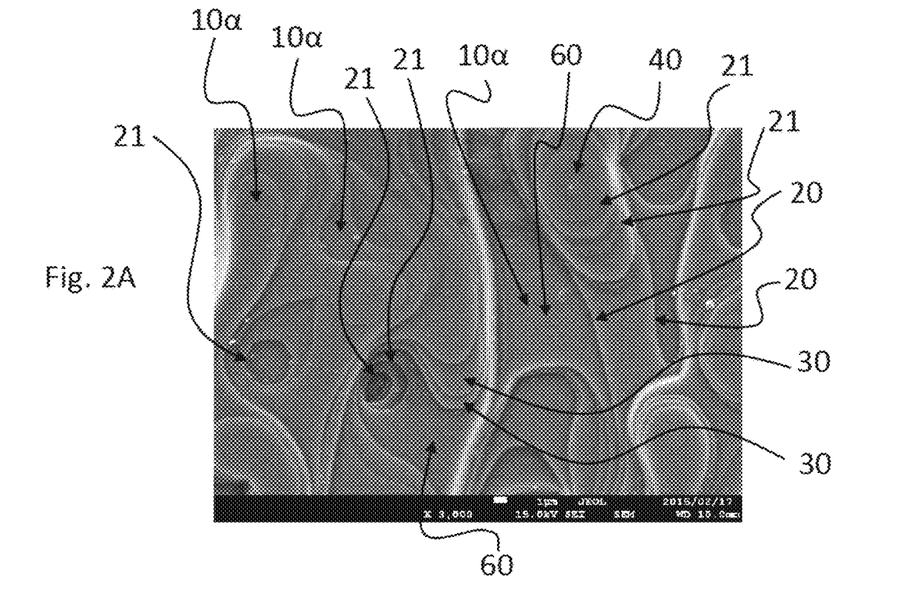
Figure 2B:
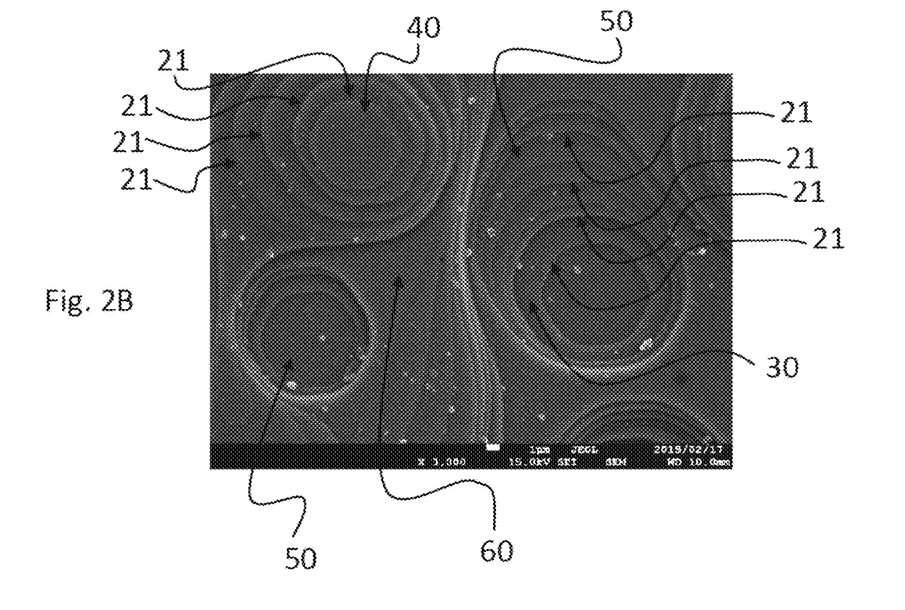

FIG. 5A is an electron micrograph of the sapphire member 1 shown in FIGS. 2A and 2B during manufacture (photograph taken immediately after the machining). FIG. 5B is an electron micrograph of the sapphire member 1 shown in FIGS. 3A and 3B during manufacture (photograph taken immediately after the machining). In the photographs shown in FIGS. 5A and 5B, the mechanically ground sapphire, which is a single crystal form of alumina, is mechanically damaged to have a large number of fine cracks and breaks. For the workpiece immediately after the machining, for example, the light transmitted through the main surface is scattered at the cracks and breaks, and appears to be white and cloudy to an observer.

The method according to the present embodiment includes heating the machined base material (workpiece) to a temperature in a range of 1800 to 2000° C., and then slowly cooling the heated base material to room temperature in not less than six hours. In the present embodiment, the machined base material is placed in a rare gas atmosphere in a furnace to undergo the heating and the slow cooling.

In the heating process, the machined base material is first placed in the chamber of the furnace and the gas in the chamber is replaced with argon (Ar), which is a rare gas. Subsequently, the temperature inside the chamber is gradually raised to 1950° C. in about 14 hours and maintained at 1950° C. for about 5 to 50 hours. The melting point of sapphire is about 2070° C. In the heating process, the temperature of the base material is raised to a temperature close to the melting point of sapphire and maintained at that temperature for a long time. Through the heating process, the outermost surface portion of the sapphire base material can, for example, partially melt to cause relaxation of atoms, and then causes reconstruction of the atoms.

During this process, fine cracks and breaks on the surface of the sapphire created by mechanical damage through the machining seem to be fixed (or the gaps are closed). Also, the fine recesses and protrusions seem to be smoothed as the atoms are reconstructed to reduce the surface energy potential, or to reduce the surface area.

After the heating process, the base material is cooled to room temperature in not less than six hours. Such gradual cooling in a long period of time facilitates crystallization of the outermost surface. In other words, the crystal portion mechanically damaged in the machining recrystallizes to correspond to the crystal portion underlying the damaged portion. Such slow cooling in a long period of time facilitates recrystallization and further smoothes the fine cracks and breaks on the damaged crystal portion.

Figure 6:
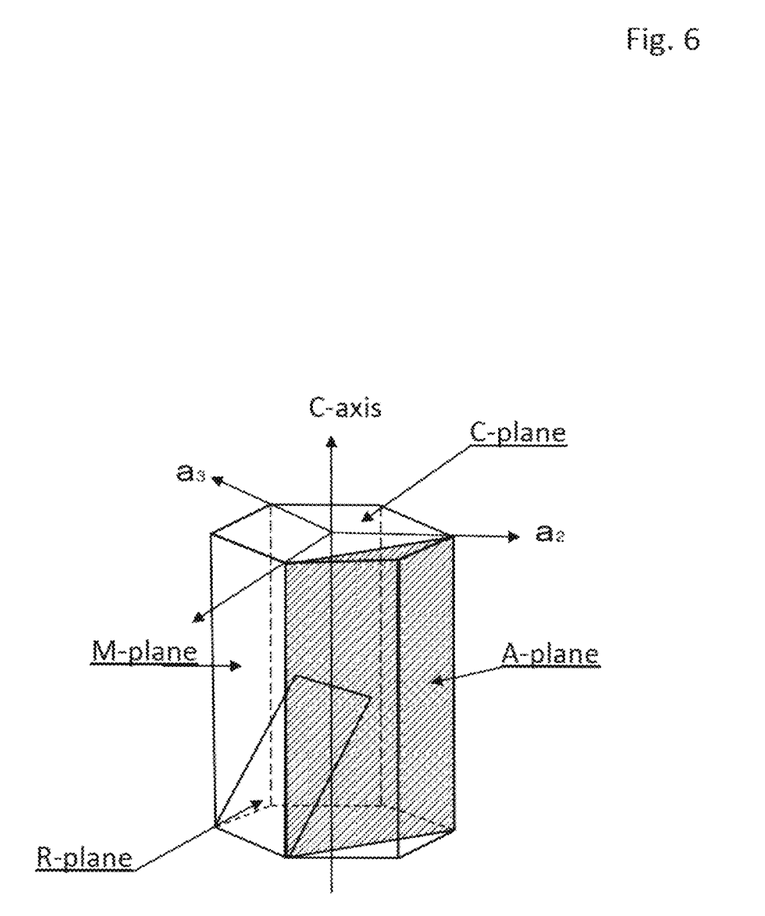
FIG. 6 is a diagram showing the crystal structure of a sapphire crystal.

FIG. 6 is a diagram showing the crystal structure of a sapphire crystal. As shown in FIG. 6, sapphire is a hexagonal system, which has a c-axis as a center axis, and a c-plane perpendicular to the c-axis, and six surfaces parallel to the c-axis, or the outer side surfaces of the hexagon, which are m-planes. Through the above machining and slow cooling, the terrace structure layers 10 having the terrace surfaces 10α, parallel to the c-plane of the sapphire crystal, and the side surfaces 10β, in contact with the terrace surfaces 10α, grow gradually. The main surface of the base material, which is substantially parallel to the c-plane of the sapphire crystal, allows a large crystal face to grow on the main surface in a direction parallel to the c-plane of the sapphire crystal. A large terrace surface 10α with a flat portion larger than at least 1 μm square can form on the main surface. The m-planes of the sapphire crystal, which are perpendicular to the c-plane of the sapphire crystal, also allow a crystal face to relatively easily form on the planes (allows crystal to be uniformly oriented). Thus, the side surfaces 10β perpendicular to the c-plane of the sapphire crystal also seem to facilitate crystal growth with a certain size to define a clear edge line 20. When the main surface is viewed in a plan in the direction perpendicular to the main surface, each terrace surface 10α has curved edge lines 20 that are not parallel to one another and a flat portion 30 larger than at least 1 μm square. A plurality of terrace surfaces 10α are arranged to have a plurality of edge lines 20 of a plurality of other stacked terrace structure layers 10.

Figure 3A:
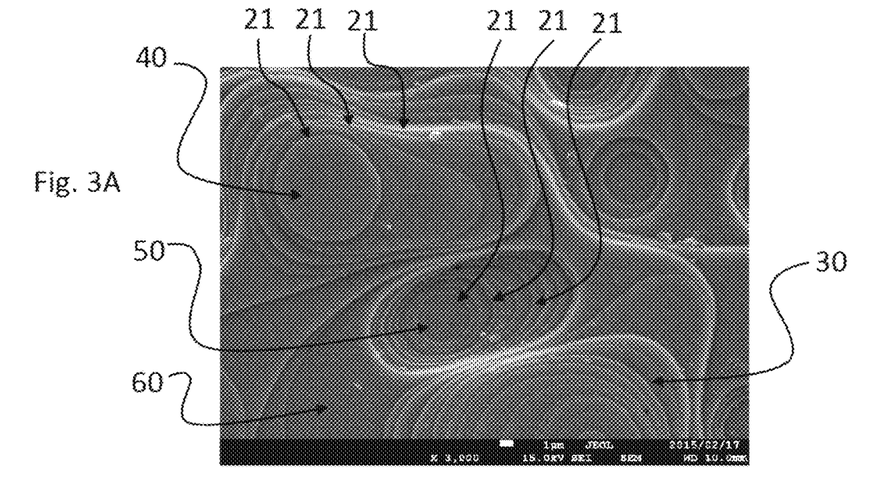
Figure 3B:
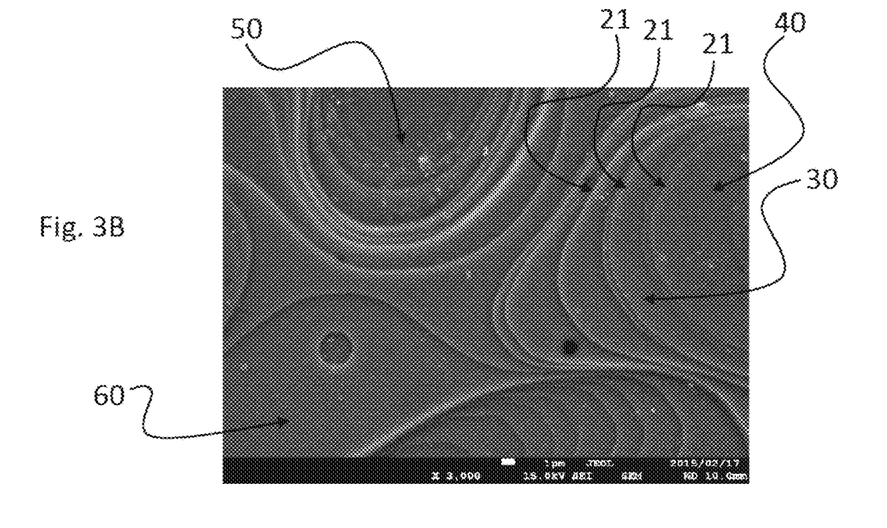

The sapphire member 1 can be manufactured through these processes. FIGS. 2A and 2B show the sapphire members 1 machined using a diamond resin plate as a polishing pad. FIG. 2A shows the sapphire member 1 heated at 1950° C. for about 5 hours and then cooled slowly. FIG. 2B shows the sapphire member 1 heated at 1950° C. for about 40 hours and then cooled slowly. FIGS. 3A to 3B show the sapphire members 1 machined using a cast iron plate as a polishing pad. FIG. 3A shows the sapphire member 1 heated at 1950° C. for about 5 hours and then cooled slowly. FIG. 3B shows the sapphire member 1 heated at 1950° C. for about 40 hours and then cooled slowly. As shown in the figures, the sapphire members 1 heated for a longer time (in the examples of FIGS. 2B and 3B) have larger terrace surfaces 10α than the sapphire members 1 heated for a shorter time (in the examples shown in FIGS. 2A and 3A). Also as shown in the figures, the sapphire members 1 heated for a longer time have larger protrusions 40 and recesses 50, and are shaped more similar to the hexagon. More specifically, the sapphire members 1 heated for a longer time have a greater growth on the m-planes. The dimensions or other characteristics of the terrace surfaces 10α, the protrusions 40, and the recesses 50A can be regulated by adjusting the heating time.

The temperature used in the heating process may not be 1950° C. The temperature may be higher than or equal to 1800° C. to form the terrace surface 10α with a relatively large size. The atmosphere in the furnace may not be limited. To form the terrace surface 10α with a relatively large size, the machined base material may be placed in a rare gas atmosphere, such as Ar, to undergo the heating and the slow cooling.

The sapphire member 1 manufactured with the manufacturing method according to the present embodiment may be used as, for example, a GaN crystal growth substrate. The manufacturing method according to the present embodiment can form the sapphire member 1 having an irregular surface substantially by simply placing the machined base material, which is to be the sapphire member 1, in a furnace, and eliminates photolithography or reactive ion etching after the machining. The manufacturing method according to the present embodiment can thus reduce the cost for manufacturing the sapphire member 1. The manufacturing method according to the present embodiment can also form the sapphire member 1 having a surface with a plurality of curved edge lines 20 that are not parallel to one another. This sapphire member 1 allows, for example, a buffer layer having high crystallinity to form on the sapphire member 1 in a short time. The manufacturing method according to the present embodiment does not use chemical-mechanical polishing (CMP) and thus prevents excessive wear at the edges (or corner wear) of the main surface, which can often be caused by CMP.

A method for manufacturing a sapphire member according to another embodiment (second embodiment) will now be described. The same flowchart as shown in FIG. 4 describes the method according to the second embodiment. The method according to the second embodiment includes machining the sapphire-based plate to have, for example, an arithmetic mean roughness Ra of greater than or equal to 0.1 μm to prepare a base material having a main surface along (substantially parallel to) an m-plane of a sapphire crystal, heating the base material to a temperature in a range of 1800 to 2000° C., and slowly cooling the heated base material to room temperature in not less than six hours. The method according to the second embodiment differs from the method in the above embodiment in that an m-plane is used as the main surface of the base material obtained through the machining. The other processes according to the second embodiment use the same conditions as described in the above embodiment.

More specifically, the method according to the second embodiment may also use, for grinding the surface of the sapphire-based plate, a surface grinder that places a workpiece into slidable contact with the surface of a moving grindstone to mechanically grind the workpiece to prepare a base material having a main surface substantially parallel to the m-plane of the sapphire crystal. The machined main surface has an arithmetic mean roughness Ra of greater than or equal to 0.1 μm, which is relatively high (the surface is rough).

Table 1 below shows the results of the experiments for determining the likelihood of particle formation on the sapphire member according to the first embodiment and another sapphire member. In Table 1, the sapphire member according to the first embodiment is the sapphire member 1 shown in FIG. 3A, or more specifically the sapphire member 1 machined using a cast iron plate as a polishing pad, heated at 1950° C. for about 5 hours, and then cooled slowly. In Table 1, the other sapphire is the sapphire member shown in FIG. 5A, or more specifically the sapphire member without the heating and the slow cooling after its polishing process. Table 1 shows the particle count measured using a light-scattering liquid particle counter (or LPC). More specifically, test samples were placed in 5 L of pure water stored in a large beaker, and then underwent ultrasonic cleaning using ultrasonic waves applied through the pure water. The total number of particles having a diameter greater than or equal to 0.2 μm separated from each test sample into the pure water after the ultrasonic cleaning was then measured with LPC CLS-700T (Particle Measuring Systems, or PMS). Five such samples each for the first embodiment and for the other sapphire were prepared, and all the test samples were measured under the same conditions.

TABLE 1

| Sample Number | First Embodiment | Other Sapphire |
| --- | --- | --- |
| 1 | 172 | 1838 |
| 2 | 232 | 3072 |
| 3 | 258 | 4647 |
| 4 | 268 | 4722 |
| 5 | 276 | 4825 |
| Average | 241.2 | 3820.8 |

As shown in Table 1, the samples according to the first embodiment have significantly fewer generated particles. This is seemingly because the fine cracks and breaks generated by the crystal portion damaged by polishing have been fixed by recrystallization through heating and slow cooling.

Figure 7A:
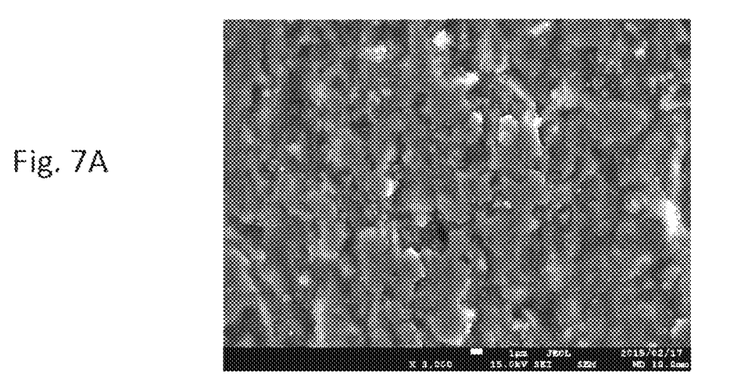
Figure 7B:
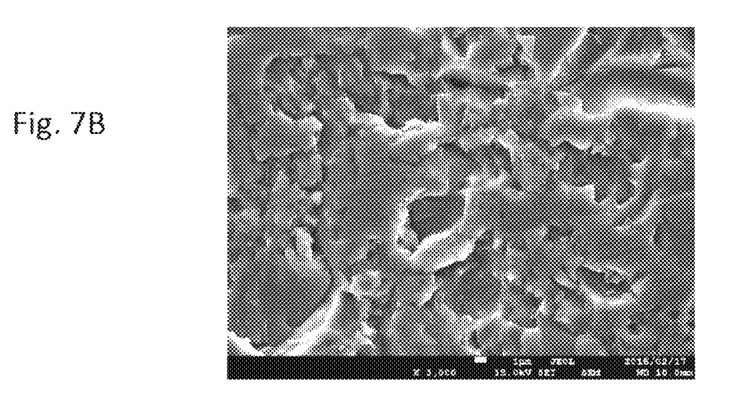

FIGS. 7A and 7B are electron micrographs each showing the main surface substantially parallel to an m-plane immediately after the machining in the second embodiment. FIG. 7A shows the sapphire member machined with a surface grinder using a resin diamond plate as a polishing pad. FIG. 7B shows the sapphire member machined with a surface grinder using a cast iron plate as a polishing pad. In the photographs shown in FIGS. 7A and 7B, the mechanically ground sapphire, which is a single crystal form of alumina, is mechanically damaged to have a large number of fine cracks and breaks.

The machining is then followed by heating the machined base material (workpiece) to a temperature in a range of 1800 to 2000° C., and then slowly cooling the heated base material to mom temperature in not less than six hours. In the second embodiment as well, the machined base material is placed in a rare gas atmosphere in a furnace to undergo the heating and the slow cooling.

In the heating process, the machined base material is first placed in the chamber of the furnace, and the gas in the chamber is replaced with Ar, which is a rare gas. Subsequently, the temperature inside the chamber is gradually raised to 1950° C. in about 14 hours and maintained at 1950° C. for about 5 to 50 hours. After the heating process, the base material is cooled to room temperature in not less than six hours. Such gradual cooling in a long period of time facilitates crystallization of the outermost surface.

Figure 8A:
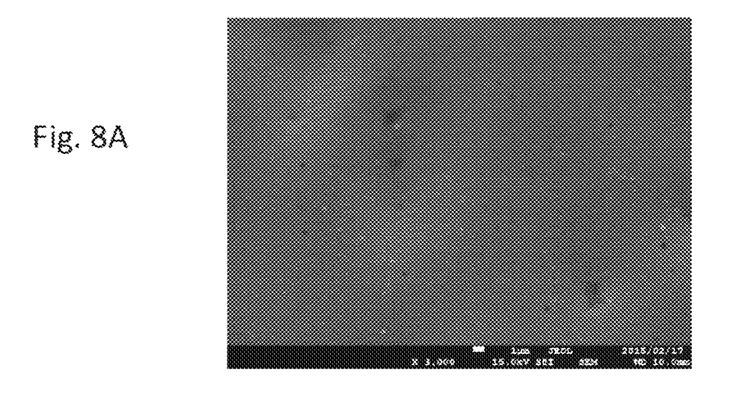
FIG. 8A is a photograph of the base material for the sapphire member shown in FIG. 7A cooled slowly after heated at 1950° C. for about 5 hours.
Figure 8B:
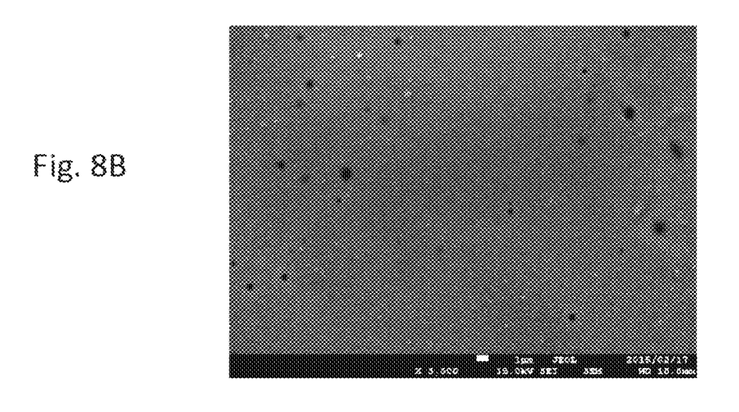
FIG. 8B is a photograph of the base material for the sapphire member shown FIG. 7A cooled slowly after heated at 1950° C. for about 40 hours.
Figure 9A:
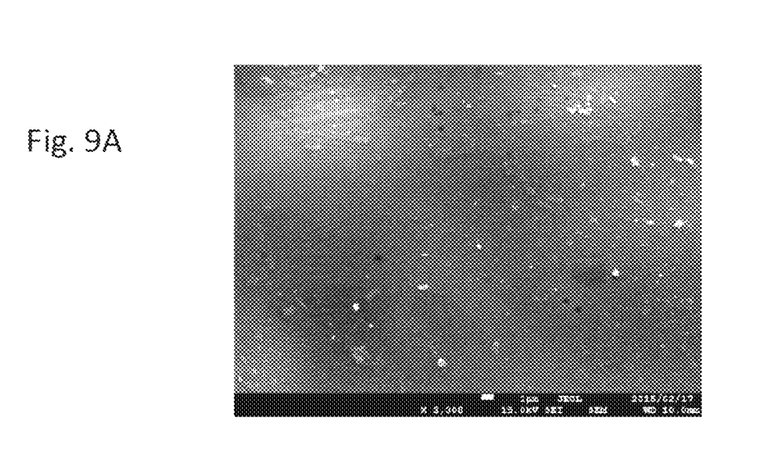
FIG. 9A is a photograph of the base material for the sapphire member shown in FIG. 7B cooled slowly after heated at 1950° C. for about 5 hours.
Figure 9B:
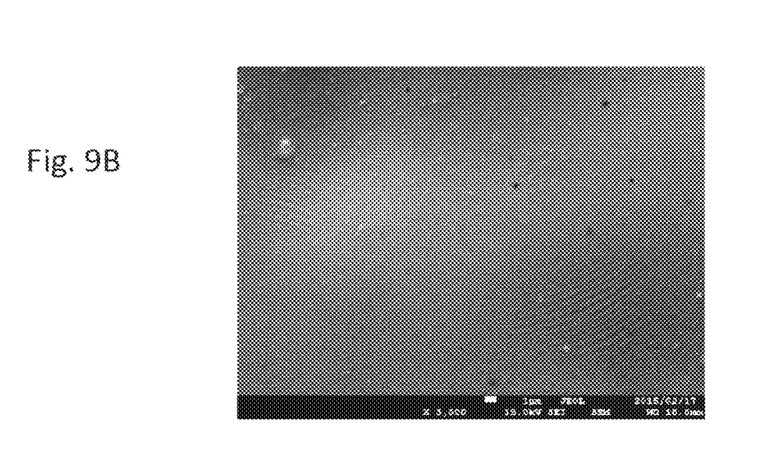
FIG. 9B is a photograph of the base material for the sapphire member shown in FIG. 7B cooled slowly after heated at 1950° C. for about 40 hours.

FIGS. 8A, 8B, 9A, and 9B are electron micrographs each showing the main surface parallel to the m-plane of a sapphire crystal that has undergone the slow cooling. FIGS. 8A and 8B are the photographs of the base material shown in FIG. 7A taken after the heating and the slow cooling. FIG. 8A shows the base material heated at 1950° C. for about 5 hours and then cooled slowly. FIG. 8B shows the base material heated at 1950° C. for about 40 hours and then cooled slowly. FIGS. 9A and 9B are the photographs each showing the base material shown in FIG. 7B taken after the heating and the slow cooling. FIG. 9A shows the base material heated at 1950° C. for about 5 hours and then cooled slowly. FIG. 9B shows the base material heated at 1950° C. for about 40 hours and then cooled slowly.

Also in the second embodiment, the portion of the crystal mechanically damaged in the machining recrystallizes to correspond to the crystal portion underlying the damaged portion. Such slow cooling facilitates recrystallization and further smoothes fine cracks and breaks on the damaged crystal portion. The electron micrographs in the second embodiment show the surface parallel to the m-plane with significantly fewer recesses and protrusions and with no perceivable boundary between the crystal layers, or with no edge lines 20 for example. This is seemingly because the m-plane of the sapphire crystal layer is uniformly oriented more easily than other crystal layers, such as the c-plane of the sapphire crystal.

The photographs in FIGS. 8A, 8B, 9A, and 9B reveal that the heating at the predetermined temperature for about five hours can sufficiently smooth the surface, and increasing the heating time to about 40 hours does not greatly change the states of the recesses and protrusions on the surface. For example, the sapphire member shown in FIG. 8A has an arithmetic mean roughness Ra of 0.25 µm, and has a main surface precisely smoothed with the manufacturing method according to the second embodiment.

The manufacturing method according to the second embodiment yields a sapphire member having a relatively flat main surface parallel to the m-plane at low cost with a relatively short time and small efforts. Sapphire, which has high hardness, is usually smoothed precisely by polishing the ground main surface of the sapphire member a plurality of times in a stepwise manner, and finally polishing the main surface by chemical mechanical polishing (CMP) using colloidal silica to have, for example, an arithmetic mean roughness Ra of lower than 0.5 µm. This smoothing process through polishing alone uses different types of large polishing machines, and takes time, ranging from half a day to several days, for the polishing operations, as well as efforts, such as frequent checks during polishing operations. The second embodiment allows the machining including polishing to be followed substantially simply by placing the sapphire member in the furnace, in which both the heating and the slow cooling are performed. This eliminates large efforts. The surface can be smoothed through a single heating process and a single slow cooling process. This shortens the total operation time. The method for manufacturing a sapphire member according to the second embodiment of the present invention thus yields a sapphire member that scatters a small portion of the transmitted light at relatively low cost. The method according to the second embodiment can also form a sapphire member having a high-precision smooth surface without CMP, and thus prevents excessive wear at the edges (or corner wear) of the main surface, which can be easily caused by polishing such as CMP.

Also in the second embodiment, the temperature used in the heating process may not be 1950° C. but may be higher than or equal to 1800° C. to provide a high-precision smooth surface. The atmosphere in the furnace may not be limited. To smooth the surface with high precision, the machined base material may be placed in a rare gas atmosphere, such as Ar to undergo the heating and the slow cooling.

Through trial-and-error experiments, the inventors of the present application have been the first to notice the difference between the surface structures with different crystal orientations of a sapphire-based member after machined at the temperature close to the melting point of sapphire, and the detailed structures.

Although the embodiments or examples of the present invention have been described above, the present invention is not limited to the above embodiments or examples. The present invention may be modified or changed in various manners without departing from the spirit and scope of the present invention.

REFERENCE SIGNS LIST

1 sapphire member
1A main surface
10 terrace structure layer
10α terrace surface
10β side surface
20 edge line
21 circle edge
30, 60 flat portion
40 protrusion
50 recess

The invention claimed is:

1. A sapphire member comprising sapphire as a main constituent and having a main surface along a c-plane of a sapphire crystal, the sapphire member comprising:
   a plurality of protrusions in at least a part of the main surface;
   a plurality of recesses in at least a part of the main surface,
   wherein each of the plurality of protrusions and each of the plurality of recesses comprises a plurality of terrace structure layers, wherein each of the plurality of terrace structure layers comprises a terrace surface along the c-plane and a side surface in contact with an edge line of the terrace surface, wherein each terrace surface includes a flat portion larger than 1 µm square, and wherein, in a plan view,
- each of the plurality of terrace structure layers has a circle edge comprising a closed curve,
- within the plurality of terrace structure layers comprised in each of the plurality of protrusions, each circle edge having a shorter perimeter is located above and enclosed within each circle edge having a longer perimeter, and,
- within the plurality of terrace structure layers comprised in each of the plurality of recesses, each circle edge having a shorter perimeter is located below and enclosed within each circle edge having a longer perimeter.

2. The sapphire member according to claim 1, wherein at least one terrace surface includes a flat portion larger than 5 µm square.

3. The sapphire member according to claim 1, wherein at least one of the circle edges is a hexagonal circle edge.

4. The sapphire member according to claim 3, wherein the hexagonal circle edge has sides each extending along an m-plane of the sapphire crystal.

5. A method for manufacturing the sapphire member according to claim 1, the method comprising:
- preparing a base material having a main surface along the c-plane of the sapphire crystal;
- heating the base material at 1950° C. for 5 to 50 hours; and
- slowly cooling the heated base material to room temperature in not less than six hours.

6. The sapphire member according to claim 1, wherein the sapphire member has a plurality of curved edge lines that are not parallel to one another.

7. The sapphire member according to claim 1, wherein the sapphire member has a plurality of curved edge lines that are not parallel to one another across the entire main surface.

* * * * *